(12) United States Patent
Gendron-Hansen et al.

(10) Patent No.: US 11,222,782 B2
(45) Date of Patent: Jan. 11, 2022

(54) SELF-ALIGNED IMPLANTS FOR SILICON CARBIDE (SIC) TECHNOLOGIES AND FABRICATION METHOD

(71) Applicant: Microchip Technology Inc., Chandler, AZ (US)

(72) Inventors: Amaury Gendron-Hansen, Bend, OR (US); Bruce Odekirk, Bend, OR (US)

(73) Assignee: Microchip Technology Inc., Chandler, AZ (US)

( * ) Notice: Subject to any disclaimer, the term of this patent is extended or adjusted under 35 U.S.C. 154(b) by 0 days.

(21) Appl. No.: 16/785,491

(22) Filed: Feb. 7, 2020

(65) Prior Publication Data
US 2021/0225645 A1    Jul. 22, 2021

Related U.S. Application Data

(60) Provisional application No. 62/962,871, filed on Jan. 17, 2020.

(51) Int. Cl.
*H01L 21/02* (2006.01)
*H01L 21/04* (2006.01)
(Continued)

(52) U.S. Cl.
CPC .. *H01L 21/02378* (2013.01); *H01L 21/02274* (2013.01); *H01L 21/02293* (2013.01);
(Continued)

(58) Field of Classification Search
None
See application file for complete search history.

(56) References Cited

U.S. PATENT DOCUMENTS 5,786,251 A * 7/1998 Harris ................ H01L 29/7802
                                                        438/268
7,851,881 B1  12/2010 Zhao et al.
(Continued)

FOREIGN PATENT DOCUMENTS

CN      100555663 C    10/2009
CN      101467262 B     1/2012
(Continued)

OTHER PUBLICATIONS

PCT/US2020/021542, International Search Report and Written Opinion, European Patent Office, dated Oct. 5, 2020.

*Primary Examiner* — Alexander G Ghyka
(74) *Attorney, Agent, or Firm* — Glass and Associates; Kenneth Glass; Kenneth D'Alessandro

(57) ABSTRACT

A method for fabricating a silicon carbide semiconductor device includes providing a SiC epitaxial layer disposed over a surface of a SiC substrate, forming an implant aperture in a hardmask layer on a surface of the expitaxial SiC layer, implanting contact and well regions in the SiC epitaxial layer through the hardmask layer, the contact region lying completely within and recessed from edges of the well region by performing one of implanting the well region through the implant aperture, reducing the area of the implant aperture forming a reduced-area contact implant aperture and implanting the contact region through the reduced-area implant aperture to form a contact region, and implanting the contact region through the implant aperture, increasing the area of the implant aperture to form a increased-area well implant aperture and implanting the well region through the increased-area implant aperture to form a well region completely surrounding the contact region.

15 Claims, 5 Drawing Sheets

Figure 1A:
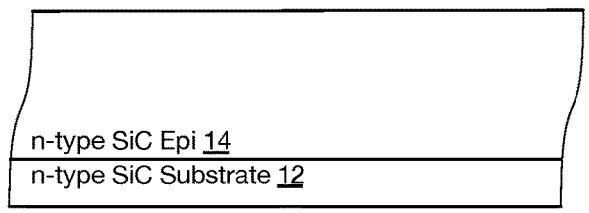

(51) Int. Cl.
*H01L 27/092* (2006.01)
*H01L 21/67* (2006.01)

(52) U.S. Cl.
CPC .... *H01L 21/02579* (2013.01); *H01L 21/0465* (2013.01); *H01L 21/0475* (2013.01); *H01L 21/67075* (2013.01); *H01L 27/0927* (2013.01)

(56) References Cited

U.S. PATENT DOCUMENTS

| | | | |
|---|---|---|---|
| 9,040,377 | B2 * | 5/2015 | Sdrulla ............... H01L 29/1095 |
| | | | 438/268 |
| 9,478,606 | B2 * | 10/2016 | Sdrulla ................... H01L 29/36 |
| 16,785,491 | | 2/2020 | Gendron-Hansen |
| 2009/0159896 | A1 | 6/2009 | Arthur et al. |
| 2013/0313570 | A1 | 11/2013 | Sdrulla et al. |
| 2014/0035055 | A1 * | 2/2014 | Shinohara ....... H01L 21/823878 |
| | | | 257/368 |
| 2016/0225624 | A1 * | 8/2016 | Horii ..................... H01L 21/045 |

FOREIGN PATENT DOCUMENTS

| | | |
|---|---|---|
| JP | 2012522372 A | 9/2012 |
| JP | 5265111 B2 | 8/2013 |
| KR | 101078470 B1 | 10/2011 |
| WO | 9749124 A1 | 12/1997 |
| WO | 2011025973 A1 | 3/2011 |
| WO | 2013177552 A1 | 11/2013 |
| WO | 2014149047 A1 | 9/2014 |
| WO | 2014204491 A1 | 12/2014 |

\* cited by examiner

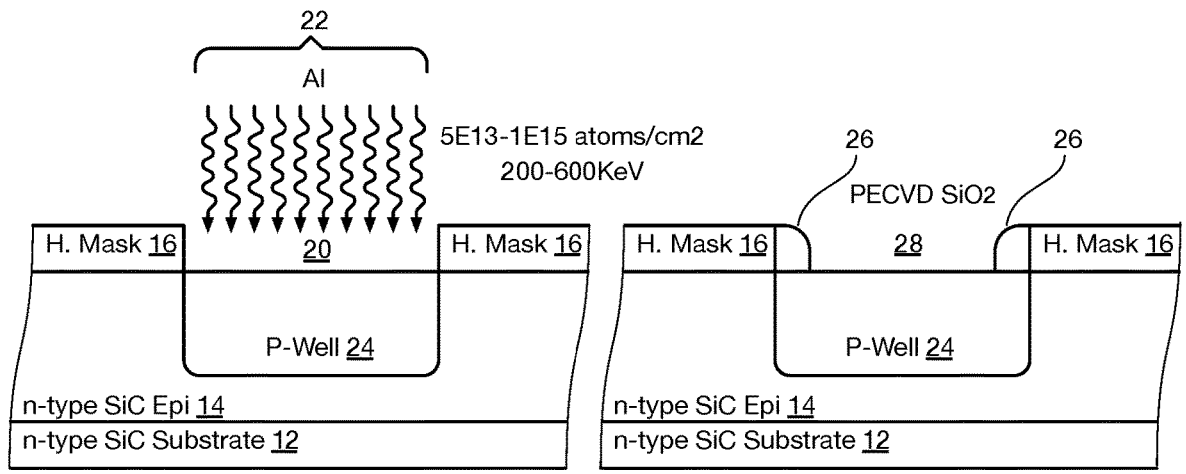
FIG. 1G
FIG. 1H
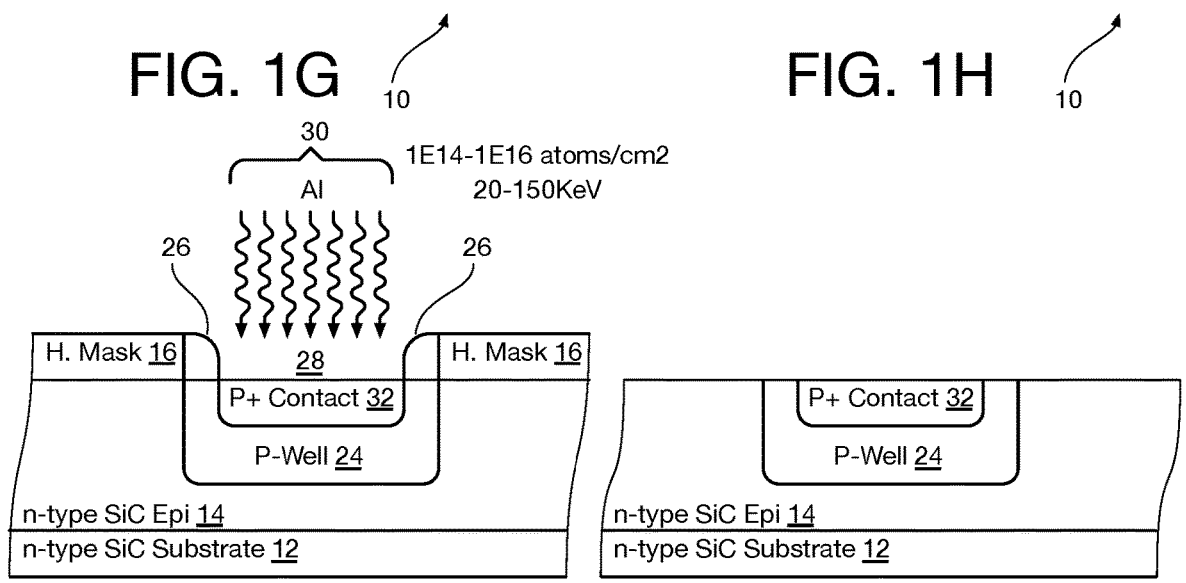
FIG. 1I
FIG. 1J
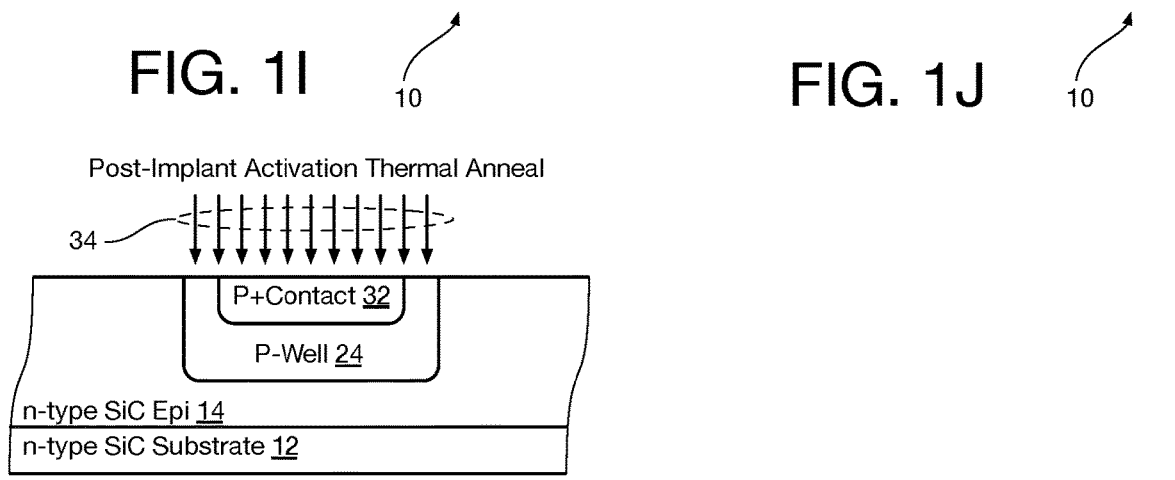
FIG. 1K

SELF-ALIGNED IMPLANTS FOR SILICON CARBIDE (SIC) TECHNOLOGIES AND FABRICATION METHOD

BACKGROUND

The present invention relates to semiconductor fabrication technology. More particularly, the present invention relates to junction barrier Schottky diodes and an implant scheme for silicon carbide (SiC) Schottky diode technologies and fabrication method.

SiC semiconductor devices such as MOSFETS and SiC Schottky diodes require p-doped contact regions with a good ohmic contact to achieve high surge currents. However, the high dose implantation required to reduce the contact resistance of the p-doped contact region introduces a high density of crystal defects which strongly affects the reverse leakage current and the long-term reliability.

One method of resolving this difficulty consists in forming a silicide on the P-doped regions, however this adds significant complexity to the process.

It would be desirable to improve the surge current without affecting the performance and the long-term reliability without adding significant complexity to the process.

BRIEF DESCRIPTION

According to an aspect of the invention, an offset is added between the masks of a deep implant and a shallow contact implant such that the edges of the shallow implant are recessed from the edges of the deep implant. This offset prevents the depletion region of the deep implant from reaching most of the crystal defects caused by the shallow contact implant.

The present invention is described herein with reference to p-type shallow contact implants within p-type wells formed in n-type SiC substrates. Persons of ordinary skill in the art will appreciate that the principles of the present invention apply to n-type shallow implants within n-type wells formed in p-type SiC substrates.

In accordance with an aspect of the invention, a method for fabricating a silicon carbide semiconductor device includes providing a silicon carbide (SiC) substrate having a SiC epitaxial layer disposed over a surface of the SiC substrate, forming an implant aperture in a hardmask layer on a surface of the expitaxial SiC layer, implanting contact and well regions in the SiC epitaxial layer through the hardmask layer, wherein the contact region lies completely within and has edges recessed from edges of the well region by performing one of implanting the well region through the implant aperture, reducing the area of the implant aperture to form a reduced-area contact implant aperture and then implanting the contact region through the smaller-area implant aperture to form a contact region lying completely within the well region, and implanting the contact region through the implant aperture, increasing the area of the implant aperture to form an increased-area well implant aperture and then implanting the well region through the increased-area implant aperture to form a well region completely surrounding the contact region.

In accordance with an aspect of the invention, implanting the well region includes forming a p-well region, and implanting the contact region includes forming a p-type contact region.

In accordance with an aspect of the invention, forming the hardmask layer over the top surface of the SiC epitaxial layer includes forming a hardmask layer from one of $SiO_2$, SiN, SiON, PSG, BPSG, and polysilicon.

In accordance with an aspect of the invention, forming the implant aperture in the hardmask layer includes masking and etching the hardmask layer.

In accordance with an aspect of the invention, etching the hardmask layer includes etching the hardmask layer using one of reactive ion etching and wet etching.

In accordance with an aspect of the invention, implanting the well region through the implant aperture in the SiC epitaxial layer includes implanting Al through the implant aperture.

In accordance with an aspect of the invention, implanting Al through the implant aperture includes implanting Al with an implant dose of from 5E13 to 1E15 atoms/cm$^2$, at an implant energy from 200 to 600 KeV.

In accordance with an aspect of the invention, reducing the area of the implant aperture to form a reduced-area contact implant aperture includes forming sidewall spacers on the hardmask layer in the implant aperture.

In accordance with an aspect of the invention, forming sidewall spacers on the hardmask layer in the implant aperture includes depositing $SiO_2$ using plasma enhanced chemical vapor deposition.

In accordance with an aspect of the invention, implanting the contact region includes implanting Al through the contact aperture with an implant dose of from 1E14 to 1E16 atoms/cm$^2$ at an energy of from 20 to 150 KeV.

In accordance with an aspect of the invention, implanting the p-type contact includes performing a sequence of implants.

In accordance with an aspect of the invention, forming the implant aperture in a hardmask layer includes forming the implant aperture in a polysilicon hardmask layer, and increasing the area of the implant aperture to form the increased-area well implant aperture includes oxidizing the surface of the polysilicon hardmask layer and removing the oxide from the surface of the polysilicon hardmask layer to enlarge the contact implant aperture to form the increased-area well implant aperture in the polysilicon hardmask layer.

In accordance with an aspect of the invention, forming the implant aperture in the hardmask layer includes masking and etching the polysilicon hardmask layer.

In accordance with an aspect of the invention, etching the polysilicon hardmask layer includes etching the polysilicon hardmask layer using one of reactive ion etching and wet etching.

In accordance with an aspect of the invention, oxidizing the surface of the polysilicon hardmask layer includes thermally growing $SiO_2$ on the surface of the polysilicon hardmask layer.

In accordance with an aspect of the invention, a semiconductor structure includes a SiC substrate having a first conductivity, a SiC epitaxial layer having the first conductivity disposed over the SiC substrate, a well region disposed in the SiC epitaxial layer, the well region having a doping level of a second conductivity opposite the first conductivity and forming a pn junction with the SiC epitaxial layer, a contact region having the second conductivity disposed in the well region, the contact region having a doping level higher than the doping level of the first conductivity, edges of the contact region recessed in from edges of the well region, wherein crystal defect damage sites created during formation of the contact region and the well are separated from a depletion region associated with the pn junction between the contact region, the well, and the SiC epitaxial region when the pn junction is reverse biased.

BRIEF DESCRIPTION OF THE DRAWING FIGURES

Figure 2A:
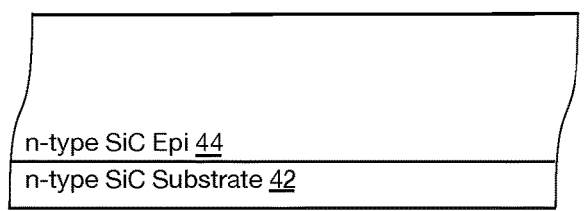
Figure 2B:
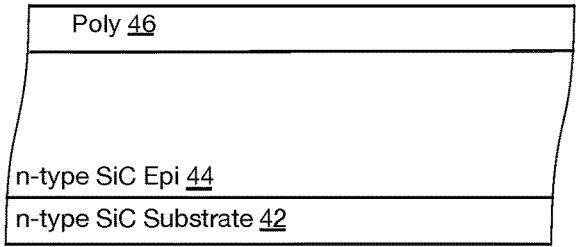
Figure 2C:
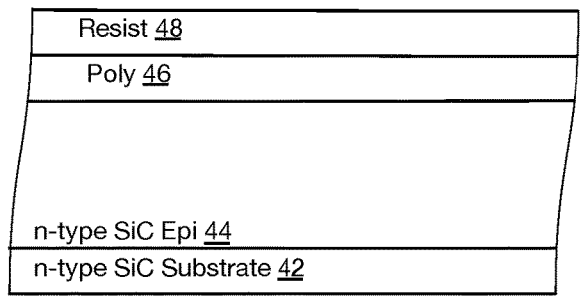
Figure 2D:
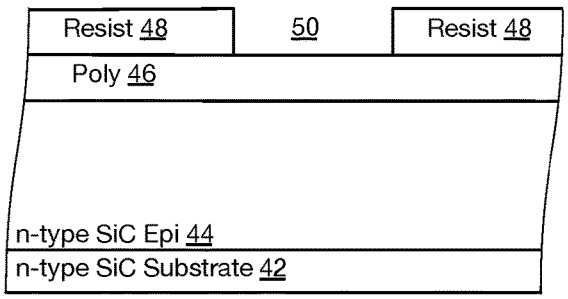
Figure 2E:
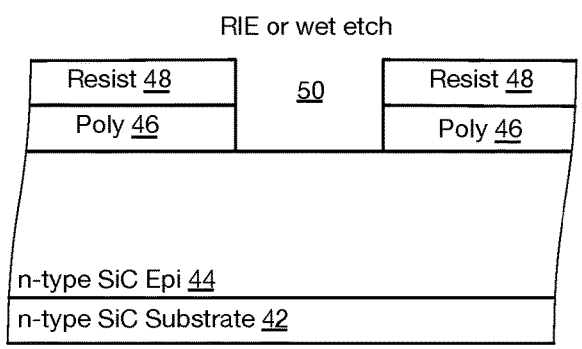
Figure 2F:
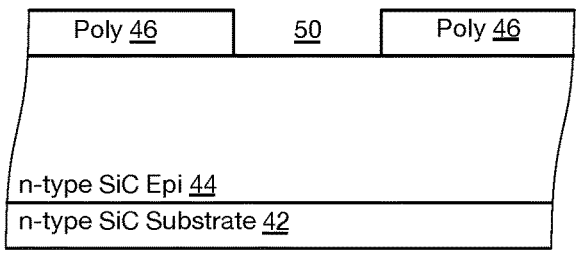
Figure 2G:
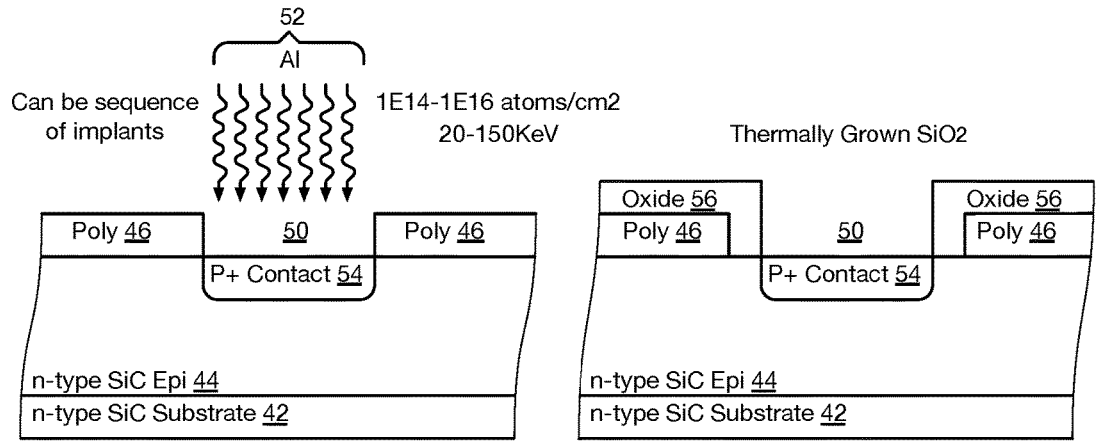
Figure 2H:
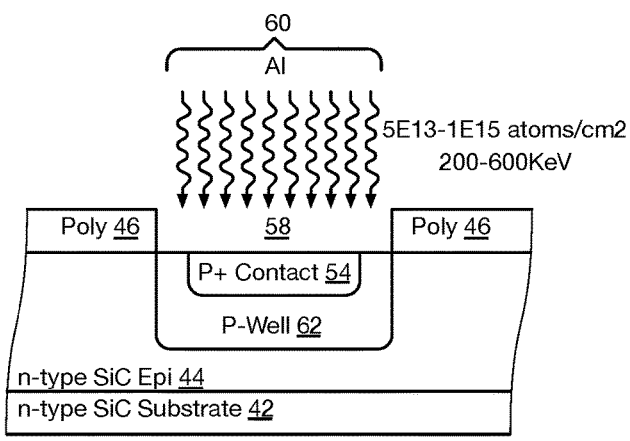
Figure 2I:
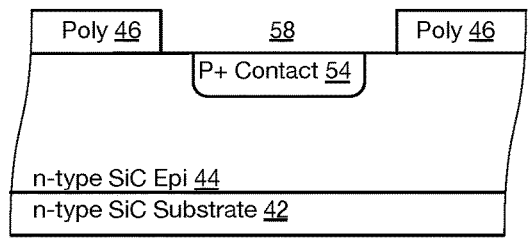
Figure 2J:
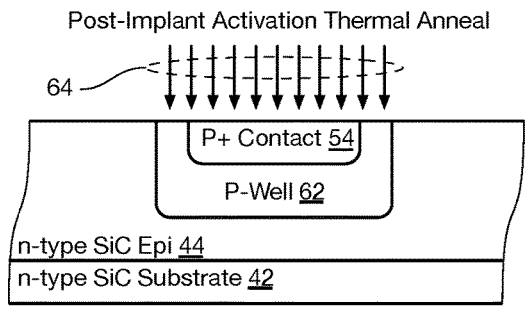
Figure 2K:
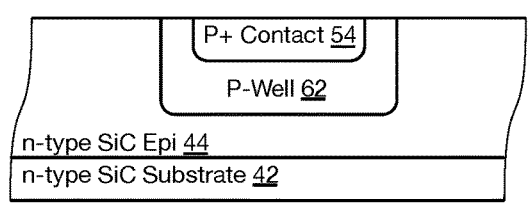
Figure 2L:
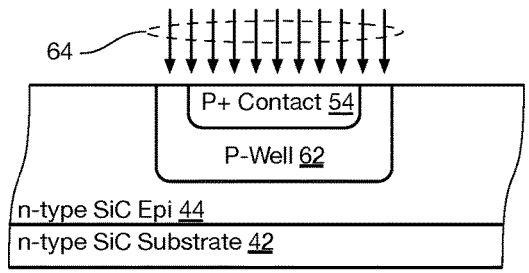
Figure 3A:
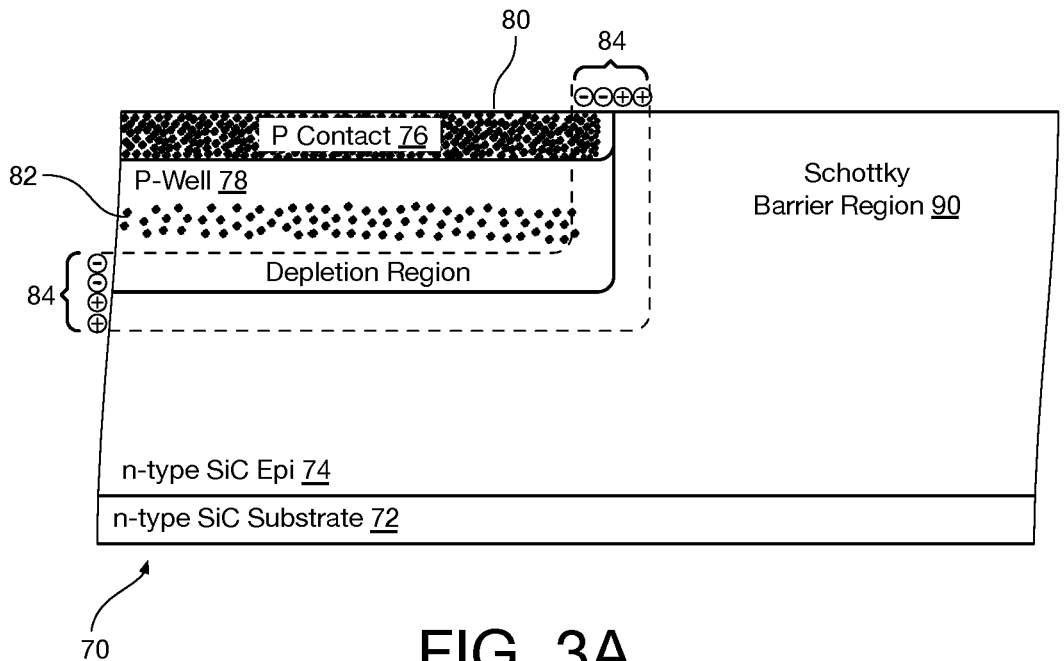
Figure 3B:
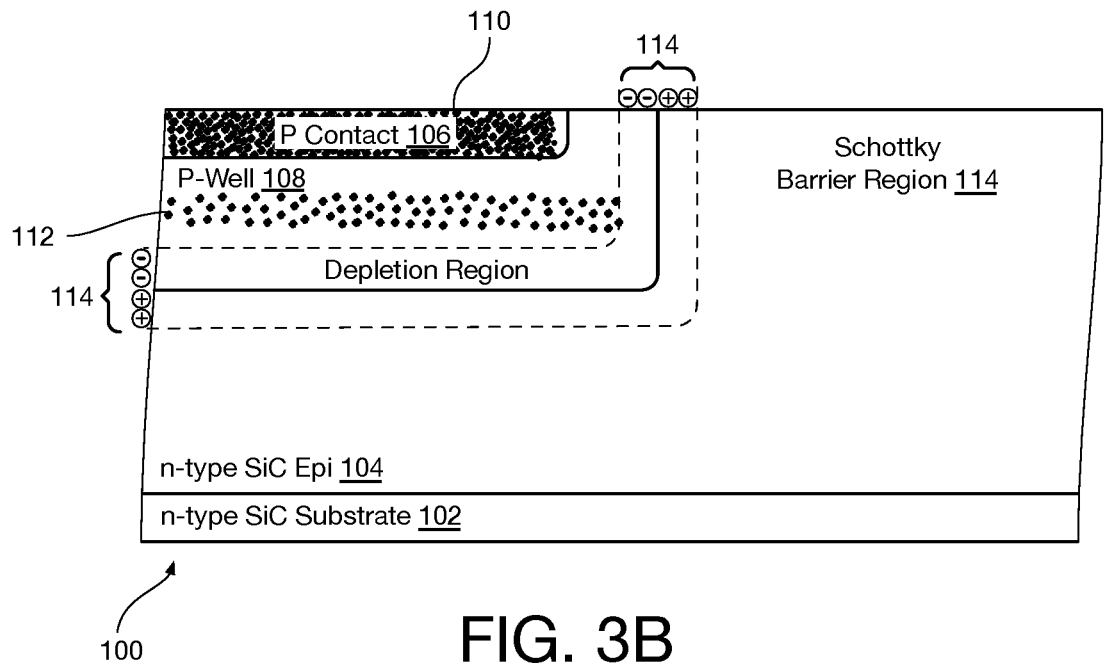

The invention will be explained in more detail in the following with reference to embodiments and to the drawing in which are shown:

FIGS. 1A through 1K are a series of cross-sectional diagrams that progressively show the fabrication of a silicon carbide semiconductor device in accordance with an aspect of the invention;

FIGS. 2A through 2L are a series of cross-sectional diagrams that progressively show the fabrication of a silicon carbide semiconductor device in accordance with an aspect of the invention; and FIGS. 3A and 3B are cross-sectional diagrams that show, respectively, the differences between the crystal defect distributions, particularly at the interface of the p-well and Schottky barrier regions, of a prior-art semiconductor device prior art and a semiconductor device fabricated in accordance with the present invention.

DETAILED DESCRIPTION

Referring first of all to FIGS. 1A though 1K, a series of cross-sectional diagrams progressively show the fabrication of a silicon carbide semiconductor device 10 in accordance with an aspect of the invention. In accordance with an aspect of the invention, the semiconductor device may be a silicon carbide (SiC) Schottky diode.

FIG. 1A shows a SiC substrate 12 on the top surface of which an epitaxial SiC layer 14 has been formed. In some embodiments of the invention the SiC substrate 12 has a thickness in the range of 350 μm±about 25 μm. In one embodiment, this layer is thinned to about 175 μm after front side processing is complete. The epitaxial SiC layer 14 for power devices has a thickness in the range of between about 5 μm and about 65 μm for voltage ratings in the range of about 700V to about 6,500V. In one embodiment, the epitaxial SiC layer 14 is between about 5 μm to about 30 μm, which may be appropriate for 700 volt to 3,000 volt devices.

In some embodiments of the invention, the SiC substrate 12 is constituted of n-type 4H—SiC, bulk grown and doped with nitrogen to obtain a low resistivity (e.g., <0.25 ohm-cm). The SiC substrate 12 serves as the cathode in vertical Schottky barrier diodes (SBD) formed using the techniques of the present invention, with ohmic contacts and packaging metallization formed on the backside. Substrates are typically 350±25 μm for both 4" and 6" wafers and can be thinned prior to backside metallization to a thickness in the range of from about 50 μm to about 200 μm. Persons of ordinary skill in the art will appreciate that the present invention applies equally well to other polytypes of SiC, such as 6H and 3C.

The epitaxial SiC layer 14 serves as the drift layer of the device and is epitaxially grown on the SiC substrate 12 with a thickness and n-type (nitrogen) doping level appropriate for the desired blocking voltage, e.g., a voltage range from about 600V to about 3,300 V. The drift layer thickness range for such devices is from about 5 μm to about 30 μm, and the doping level range is from about $1E15$ $cm^{-3}$ to about $2E16$ $cm^{-3}$.

The Schottky diode barrier height is in the range of from about 0.8V to about 1.5V (e.g., about 1.2V). Under full rated reverse bias, the Schottky barrier would have excessive current leakage due to the relatively low value of the barrier height. This excessive leakage is mitigated by introducing p-wells into the anode (drift layer surface) by ion implantation of a species such as Al as will be disclosed herein. As is well known in the art the p-wells are uniformly spaced over the entire anode region such that under high reverse bias depletion regions spread from p-well to p-well, providing shielding of the Schottky barrier from the high fields induced by the reverse bias. Such a structure is called a Junction Barrier Schottky Diode (JBS Diode).

Figure 1B:
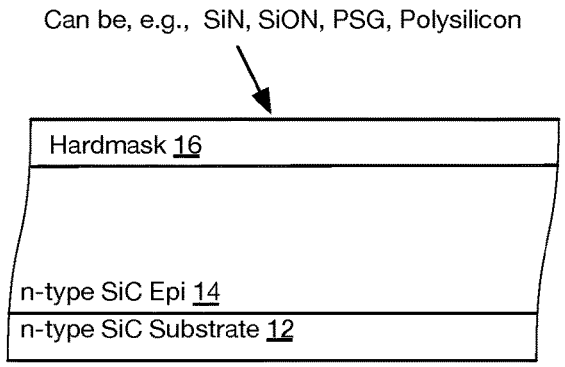

FIG. 1B shows the structure resulting after an implant hardmask layer 16 having a thickness sufficient to block the highest energy implant used has been deposited on the top surface of the epitaxial SiC layer 14. In accordance with one non-limiting example, the hardmask may be formed from a 16 kÅ thick PECVD (Plasma Enhanced Chemical Vapor Deposition) $SiO_2$ layer. Other useful alternatives for the hardmask layer include materials available that are readily deposited and etched, such as SiN, SiON, PSG, BPSG, and polysilicon.

Figure 1C:
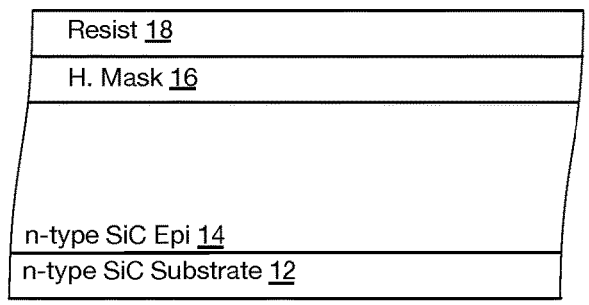
Figure 1D:
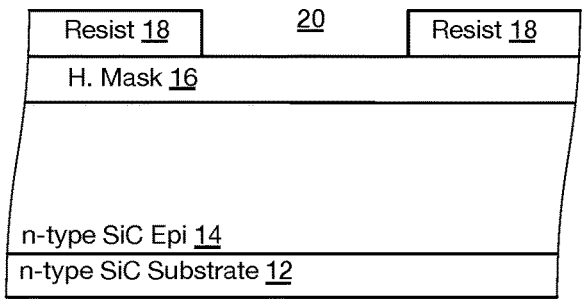

As shown in FIG. 1C, a photoresist layer 18 is applied over the hardmask layer and, as shown in FIG. 1D the photoresist layer 18 is patterned using known photolithographic techniques to create an implant aperture 20 that will be used as a well implant aperture. While only a single implant aperture 20 is illustrated, as indicated above multiple implant apertures 20 are created uniformly spaced over the entire anode region, i.e., over the entire major surface area of epitaxial SiC layer 14.

Figure 1E:
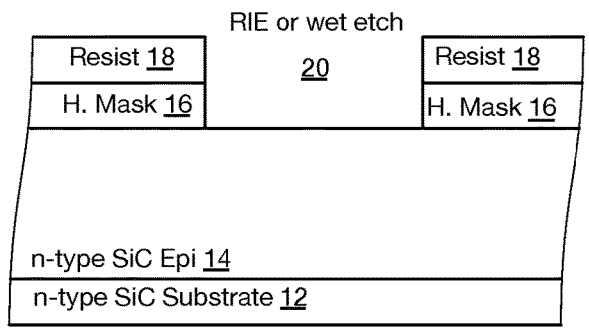
Figure 1F:
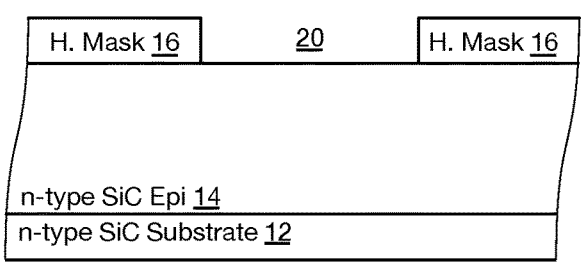

As shown in FIG. 1E, the hardmask layer 16 is etched to the surface of the SiC epitaxial layer to pattern implant aperture 20 in the hardmask, thus defining the extent of a well to be formed by ion implantation. In some embodiments of the invention, reactive ion etching (RIE) can be performed and in other embodiments of the invention wet etching can be used. As shown in FIG. 1F, the photoresist layer 18 is then removed using conventional techniques.

In accordance with the illustrative embodiments described herein, p-wells and p-type contacts are formed. The techniques of the present invention are intended to apply equally to formation of n-wells and n-type contacts in semiconductor devices.

As shown in FIG. 1G, an ion implant, represented as arrows 22 is performed through implant aperture 20 formed in the hardmask 16 to form a p-well 24 in the SiC epitaxial layer 14. This implant is a medium dose implant through the implant aperture 20 in the hardmask 16 to establish a deep p-well (depth between about 0.5 μm and about 2.5 μm, e.g., 1 μm). In embodiments of the invention, an aluminum (Al) acceptor dopant is used, implanted at a temperature range of 500° to 1,000° C., e.g., 600° C. The implant energy may be from about 200 to about 600 KeV, e.g., 370 keV. The implant dose may be from $5E13$ to $1E15$ atoms/$cm^2$, e.g., $3E14$ atoms/$cm^2$. In accordance with other embodiments of the invention, Boron (B) could be used as a dopant species for this implant.

Next, as shown in FIG. 1H, sidewall spacers 26 are formed, to define a reduced-area contact implant aperture 28 that is self-aligned to the p-well 24. The sidewall spacers 26 will be used to recess the outer periphery of a later contact region implant inward from the periphery of the p-well 24. In one embodiment of the invention, the sidewalls spacers 26 are formed from between about 0.1 and 1.0 μm (e.g., about 0.25 μm) of $SiO_2$ deposited by plasma enhanced chemical vapor deposition (PECVD). Anisotropic reactive ion etching (RIE) is then employed to remove film from horizontal surfaces while leaving film on vertical surfaces of sidewall spacers 26. In other embodiments of the invention, the sidewall spacers 26 may be formed from other materials having deposition conformality better than 50% that can be etched anisotropically leaving a sidewall thickness≥50% of deposited film thickness.

After the sidewall spacers 26 have been formed, a high dose, shallow implant is performed in the reduced-area contact implant aperture 28 formed through the hardmask layer 16, as indicated by arrows 30 to form a p-type contact region 32 (P+contact) to enable good electrical contact to the deep p-well 24. This implant has a depth between about 0.1 μm and about 0.5 μm, e.g., 0.3 μm. In embodiments of the invention, Al acceptor dopant is used, implanted at a temperature range of 500° to 1,000° C., e.g., 600° C. The implant energy may be from about 20 to about 150 KeV, e.g., 30 keV. The implant dose may be from 1E14 to 1E16 atoms/cm$^2$, e.g., 1E15 atoms/cm$^2$. This implant can be performed as a sequence of implants (chained implants) to optimize the doping profile for ohmic contact formation. In accordance with other embodiments of the invention, B could be used as a dopant species for this implant.

Next, as shown in FIG. 1J, the hardmask layer 16 is removed. As shown in FIG. 1K, the implants are activated using a thermal implant activation step as indicated by arrows 34.

Referring now to FIGS. 2A though 2K, a series of cross-sectional diagrams progressively show the fabrication of a silicon carbide semiconductor device 40 in accordance with an aspect of the invention. FIG. 2A shows a SiC substrate 42 on which an epitaxial SiC layer 44 has been formed. Like the SiC substrate 12 of FIGS. 1A through 1K, SiC substrate 42 and the epitaxial SiC layer 44 are the same as the SiC substrate 12 and the epitaxial SiC layer 14 of FIG. 1. In some embodiments of the invention the SiC substrate 42 has a thickness in the range of 350 μm±about 25 μm. In one embodiment, this layer is thinned to about 175 μm after front side processing is complete. Like the epitaxial SiC layer 14 of FIGS. 1A through 1K, the epitaxial SiC layer 44 for power devices has a thickness in the range of between about 5 μm and about 65 μm for voltage ratings in the range of about 700V to about 6,500V. In one embodiment, the epitaxial SiC layer 44 is between about 5 μm to about 30 μm, which may be appropriate for 700 to 3,000 volt devices.

FIG. 2B shows the structure resulting after a layer of polysilicon 46 to be used as a hardmask and having a thickness sufficient to block the highest energy implant used (thickness selected to account for loss of thickness in a subsequent oxidation step) has been deposited. In accordance with one non-limiting example, the polysilicon hardmask may be formed using a 15 kÅ thick layer of polysilicon 46 formed using chemical vapor deposition (CVD). Other useful alternatives for the polysilicon hardmask layer include materials that have oxidation properties similar to those of polysilicon.

As shown in FIG. 2C, a photoresist layer 48 is applied over the polysilicon hardmask layer 46 and, as shown in FIG. 2D the photoresist layer 48 is patterned using known photolithographic techniques to create an implant aperture 50. While only a single implant aperture 50 is illustrated, as indicated above multiple implant apertures 50 are created uniformly spaced over the entire anode region, i.e. over the entire major surface area of epitaxial SiC layer 44.

As shown in FIG. 2E, the polysilicon hardmask layer 46 is etched to the surface of the SiC epitaxial layer to pattern the implant aperture 50 through the polysilicon hardmask layer 46 thus defining the width of a contact implant to be formed by ion implantation. In some embodiments of the invention, RIE can be performed and in other embodiments of the invention wet etching can be used. As shown in FIG. 2F, the photoresist layer 48 is then removed using conventional techniques As shown in FIG. 2G, an ion implant, represented as arrows 52 is performed through the implant aperture 50 formed in the polysilicon hardmask 46 to form a p-type contact region 54 in the SiC epitaxial layer 44. This implant is a shallow high dose implant through the implant aperture 50 to establish the p-type contact region 54 (depth between about 0.1 μm and about 0.5 μm, e.g., 0.3 μm) for a p-well to be formed later in the process. In embodiments of the invention, an Al acceptor dopant is used, implanted at a temperature range of 500° to 1,000° C., e.g., 600° C. The implant energy may be from about 20 to about 150 KeV, e.g., 30 keV. The implant dose may be from 5E14 to 1E16 atoms/cm$^2$, e.g., 3E15 atoms/cm$^2$. In accordance with other embodiments of the invention, B could be used as a dopant species for this implant.

As shown in FIG. 2H, the surface of the polysilicon hardmask layer 46 is oxidized. In one embodiment of the invention, a thermal oxidation of the polysilicon hardmask layer 46 is performed to form a SiO$_2$ oxide layer 56 on the top surface and sidewalls of polysilicon hardmask layer 46, i.e. on the sidewalls of the implant aperture 50. In embodiments of the present invention, the thickness of the SiO$_2$ oxide layer 56 is between about 0.1 μm to about 0.5 μm (e.g., 0.25 μm). The portion of the SiO$_2$ oxide layer that will be grown on the top surface of the epitaxial SiC layer 44 will be very thin (<250 Å) due to the much lower oxidation rate of SiC, hence very little of the p-type contact region implant 44 will be consumed by the thermal oxidation.

As shown in FIG. 2I, the SiO$_2$ oxide layer 56 that was formed in the previous step is removed by etching, resulting in an increased-area well implant aperture 58 having an increased width as compared with and self-aligned to the implant aperture 50. This assures that the outer periphery of the p-type contact region 44 will be recessed inwardly from an outer periphery of a p-well implant to be formed next in the process. In accordance with an embodiment of the invention, the inward recess will be from between about 0.1 and 1.0 μm (e.g., about 0.25 μm).

In an embodiment of the invention, a wet etch removal of SiO$_2$ oxide layer 56 utilizing (hydrofluoric acid) HF can be employed. This will also remove the oxide grown on the SiC epitaxial layer 44 but will not etch the underlying SiC epitaxial layer 44. RIE can also be employed but is less desirable due to possible etching of the SiC epitaxial layer 44.

As shown in FIG. 2J, an ion implant, represented as arrows 60 is performed through the increased-area well implant aperture 58 in the polysilicon hardmask 46 to form a p-well 62 in the SiC epitaxial layer 44. This implant is a medium dose implant through the increased-area well implant aperture 58 formed in the hardmask 46 and forms a deep p-well (depth between about 0.5 μm and about 2.5 μm, e.g., 1 μm). In embodiments of the invention, Al acceptor dopant is used, implanted at a temperature range of 500° to 1,000° C., e.g., 600° C. The implant energy may be from about 200 to about 600 keV, e.g., 370 keV. The implant dose may be from 5E13 to 1E15 atoms/cm$^2$, e.g., 3E14 atoms/cm$^2$. In accordance with other embodiments of the invention, B could be used as a dopant species for this implant.

Next, as shown in FIG. 2K, the polysilicon hardmask layer 46 is removed. As shown in FIG. 2L, the p-type contact implant 54 and p-well implant 62 are activated using a thermal implant activation step as indicated by arrows 64.

After the processes depicted in FIGS. 1A through 1K and 2A through 2L, well-known backend processing steps (not shown) are performed to form contacts to, and passivate, the semiconductor device.

The contact implant needs to be shallow and of high dose to enable adequate ohmic contact formation to the p-wells. For this contact formation, implant energies can be in the range of from about 20 keV to about 100 keV (e.g., about 30 keV) and implant doses can be in the range from about 5E14 to about 1E16 cm$^{-2}$ (e.g., 1E15 cm$^{-2}$) as has been noted. In one embodiment, Al is implanted at elevated wafer temperature (500° C.-1,000° C., e.g., 600 C) to minimize the net residual implant damage remaining after high temperature (>1,600° C.) implant activation. While the heated implant and subsequent high temperature anneal significantly reduces residual implant damage, it does not eliminate it. In particular, there is a high density of crystal defect damage remaining near the peak of the high dose shallow implant. If these damage sites appear in the depletion region of a reverse biased pn junction, they will act as generation and recombination (G-R) centers resulting in excessive reverse bias current. In addition, this G-R leakage can have a strong temperature dependence, causing instability in reverse bias leakage at increased temperature (100-175 C). This effect can cause devices to fail reverse bias leakage specifications and, in some cases, can cause thermal runaway in high temperature reverse bias situations, resulting in catastrophic device failure.

The p-well Al implant energy can be in the range of from about 200 keV to about 500 keV (e.g., 360 keV) and the dose can be in the range of from about 5E13 cm$^{-2}$ to about 1E15 cm$^{-2}$ (e.g., about 3E14 cm$^{-2}$). The location of the crystal defect band from the p-well implant depends on the implant energy and in the example of a 30 keV implant is about 0.1-0.25 μm from the surface of the SiC. The total depth of the 370 keV Al p-well implant is about 1.0 μm, with the crystal defect band at about 0.4-0.5 μm from the surface of the SiC. The essentially damage free region extending about 0.5 μm underneath the p-well damage zone is sufficient to shield both crystal defect damage zones, i.e. the crystal defect band and the residual damage zone, from reverse bias depletion region intrusion from underneath. However, it has been shown that there is very little shielding of the high defect region of the shallow heavy p-type contact implant near the SiC surface in prior-art SiC semiconductor structures where the p-type contact extends to the edge of the p-well. Consequently, under high reverse bias, the depletion region formed in the near surface region can extend into that high damage region, causing a large increase in reverse bias leakage current. The methods described herein provide means of completely shielding the contact implant damage from the reverse bias depletion region.

Referring now to FIGS. 3A and 3B, cross-sectional diagrams show, respectively, the differences between the crystal defect distributions, particularly at the interface of the p-well and Schottky barrier regions, of a prior-art semiconductor device and a semiconductor device fabricated in accordance with the present invention.

In FIG. 3A, a prior-art semiconductor structure 70 is shown formed on a SiC substrate 72 having an epitaxial SiC layer 74 formed over it. A p-type contact 76 is formed in a p-well 78. The p-type contact 76 extends to the edge of the p-well 78. Both of the crystal defect damage sites 80 and 82 appear in the implanted regions of the p-type contact 76 and the p-well 78, respectively. The density of these defect sites is proportional to the peak of the implant concentration per unit volume. The peak of the implant concentration in the p-type contact 76 is in the range 5E19-5E21 cm$^{-3}$ (e.g., 3E20 cm$^{-3}$), whereas the peak of the implant concentration in the p-well 78 is in the range 1E18 to 5E19 cm$^{-3}$ (e.g., 9E18 cm$^{-3}$). Consequently, the defect density in the p-type contact 76 is approximately 30 times higher than in the p-well 78.

Unlike silicon-based semiconductor structures where annealing and drive-in steps repair the crystal defect damage caused by the implants, annealing does not completely repair crystal damage in SiC structures. The crystal defect damage sites 80 and 82 remain, at least residually. In particular, the crystal defect damage site 80 in the p-type contact region 76 extends substantially into the depletion region (indicated by circled "+" and "−" charges within the brackets at reference numeral 84) that will be created when the pn junction between the p-type contact 76 and the epitaxial SiC layer 74 is reverse biased during normal operation of the semiconductor device. The crystal defect damage site 80 will act as carrier generation and recombination (G-R) centers resulting in excessive reverse bias current. In addition, and as previously noted, because this G-R leakage has a strong temperature dependence, it will cause instability in reverse bias leakage at increased temperature (100° C. to 175° C.). From an examination of FIG. 3A it can be seen that the crystal defect damage site 82 in the p-well 78 extends slightly into the depletion region 84, but the reverse bias current leakage that the crystal defect damage site 82 causes is minimal.

In FIG. 3B, a semiconductor structure 100 in accordance with an aspect of the present invention is shown formed on a SiC substrate 102 having an epitaxial SiC layer 104 formed over it. A p-type contact 106 is formed in a p-well 108. The p-type contact 106 is formed as is described with reference to FIGS. 1A through 1K and 2A through 2J and is thus recessed back from the edge of the p-well 108 in a self-aligned manner. As can be seen from an examination of FIG. 3B, both of the crystal defect damage sites 110 and 112 created during the implant steps for the p-type contact 106 and the p-well 108, remain at least residually after annealing. However, because the p-type contact region 106 is recessed from the edge of the p-well 108, there is no pn junction created between the p-type contact 106 and the epitaxial SiC layer 104. The crystal defect damage site 110 in the p-type contact 106 is positioned away from the depletion region (indicated by circled "+" and "−" charges within the brackets at reference numeral 114) that will be created when the pn junction between the p-well 108 and the epitaxial SiC layer 74 is reverse biased. Thus, unlike the prior-art semiconductor structure depicted in FIG. 3A, the crystal defect damage site 110 will not act as a carrier generation and recombination center and will not result in excessive reverse bias current through the p-type contact 106. Like the prior-art example shown in FIG. 3A, it can be seen that the crystal defect damage site 112 in the p-well 108 extends slightly into the depletion region 114, but the reverse bias current leakage that the crystal defect damage site 112 causes in the depletion region 114 is minimal.

The present invention involves a simple process step and does not significantly increase the processing cost. In addition, the present invention provides freedom to increase the dose of the contact implant to reduce the P-doped regions contact resistance without the negative effects of residual implant damage appearing near the pn junction.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for fabricating a silicon carbide semiconductor device comprising:
providing a silicon carbide (SiC) substrate having a SiC epitaxial layer disposed over a surface of the SiC substrate, the SiC substrate having a first conductivity and the SiC epitaxial layer having the first conductivity;
forming an implant aperture in a hardmask layer on a surface of the SiC epitaxial layer;
implanting a contact region and a well region in the SiC epitaxial layer through the hardmask layer, the contact region and the well region having a doping level of a second conductivity opposite the first conductivity, wherein the contact region lies completely within the well region, is not in contact with a region having the first conductivity and has edges recessed from edges of the well region by performing one of:
implanting the well region through the implant aperture, reducing the area of the implant aperture to form a reduced-area contact implant aperture and then implanting the contact region through the smaller-area implant aperture to form a contact region lying completely within the well region; and
implanting the contact region through the implant aperture, increasing the area of the implant aperture to form an increased-area well implant aperture and then implanting the well region through the increased-area well implant aperture to form a well region completely surrounding the contact region.

2. The method of claim 1 wherein:
implanting the well region comprises forming a p-well region; and
implanting the contact region comprises forming a p-type contact region.

3. The method of claim 1 wherein forming the hardmask layer over the top surface of the SiC epitaxial layer comprises forming a hardmask layer from one of $SiO_2$, SiN, SiON, PSG, BPSG, and polysilicon.

4. The method of claim 1 wherein forming the implant aperture in the hardmask layer comprises masking and etching the hardmask layer.

5. The method of claim 4 wherein etching the hardmask layer comprises etching the hardmask layer using one of reactive ion etching and wet etching.

6. The method of claim 1 wherein implanting the well region through the implant aperture in the SiC epitaxial layer comprises implanting Al through the implant aperture.

7. The method of claim 6 wherein implanting Al through the implant aperture comprises implanting Al with an implant dose of from 5E13 to 1E15 atoms/cm$^2$, at an implant energy from 200 to 600 KeV.

8. The method of claim 1 wherein reducing the area of the implant aperture to form the reduced-area contact implant aperture comprises forming sidewall spacers on the hardmask layer in the implant aperture.

9. The method of claim 8 wherein forming sidewall spacers on the hardmask layer in the implant aperture comprises depositing $SiO_2$ using plasma enhanced chemical vapor deposition.

10. The method of claim 1 wherein implanting the contact region comprises implanting Al through the contact aperture with an implant dose of from 1E14 to 1E16 atoms/cm$^2$ at an energy of from 20 to 150 KeV.

11. The method of claim 10 wherein implanting the p-type contact comprises performing a sequence of implants.

12. The method of claim 1 wherein:
forming the implant aperture in a hardmask layer comprises forming the implant aperture in a polysilicon hardmask layer; and
increasing the area of the implant aperture to form the increased-area well implant aperture comprises oxidizing the surface of the polysilicon hardmask layer and removing the oxide from the surface of the polysilicon hardmask layer to enlarge the contact implant aperture to form the increased-area well implant aperture in the polysilicon hardmask layer.

13. The method of claim 12 wherein forming the implant aperture in the hardmask layer comprises masking and etching the polysilicon hardmask layer.

14. The method of claim 13 wherein etching the polysilicon hardmask layer comprises etching the polysilicon hardmask layer using one of reactive ion etching and wet etching.

15. The method of claim 12 wherein oxidizing the surface of the polysilicon hardmask layer comprises thermally growing $SiO_2$ on the surface of the polysilicon hardmask layer.

* * * * *